(12) United States Patent
Kim et al.

(10) Patent No.: US 9,166,166 B2
(45) Date of Patent: Oct. 20, 2015

(54) DEPOSITION MASK, METHOD OF MANUFACTURING DISPLAY APPARATUS BY USING THE DEPOSITION MASK, AND DISPLAY APPARATUS MANUFACTURED BY THE METHOD

(71) Applicant: Samsung Display Co., Ltd., Yongin, Gyeonggi-Do (KR)

(72) Inventors: Nam-Jin Kim, Yongin (KR); Chul-Hwan Park, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/030,502

(22) Filed: Sep. 18, 2013

(65) Prior Publication Data
US 2014/0306600 A1    Oct. 16, 2014

(30) Foreign Application Priority Data
Apr. 16, 2013    (KR) .................. 10-2013-0041835

(51) Int. Cl.
H05B 33/10  (2006.01)
H01L 51/00  (2006.01)
C23C 14/04  (2006.01)
H01L 51/52  (2006.01)

(52) U.S. Cl.
CPC .......... *H01L 51/0011* (2013.01); *C23C 14/042* (2013.01); *H01L 51/5253* (2013.01)

(58) Field of Classification Search
CPC ............... H01L 51/0097; H01L 2251/5338; H01L 51/5253; G02F 1/1333; Y10S 438/958; Y10S 428/917; Y10T 428/2991

USPC ............ 313/512, 504, 506; 445/24; 438/624, 438/627
See application file for complete search history.

(56) References Cited

U.S. PATENT DOCUMENTS

| | | | |
|---|---|---|---|
| 5,757,126 A * | 5/1998 | Harvey et al. ................. | 313/506 |
| 6,306,547 B1 | 10/2001 | Kobayashi | |
| 7,621,794 B2 * | 11/2009 | Lee et al. ......................... | 445/25 |
| 2003/0165641 A1 | 9/2003 | Imai et al. | |
| 2003/0198830 A1 * | 10/2003 | Kim et al. ..................... | 428/690 |
| 2008/0309226 A1 * | 12/2008 | Kim et al. ..................... | 313/504 |

FOREIGN PATENT DOCUMENTS

| | | |
|---|---|---|
| KR | 2000-0057061 A | 9/2000 |
| KR | 10-2010-0049518 A | 5/2010 |

* cited by examiner

*Primary Examiner* — Tracie Y Green
(74) *Attorney, Agent, or Firm* — Robert E. Bushnell, Esq.

(57) ABSTRACT

A deposition mask that prevents the occurrence of defects when forming an encapsulation film or securing a long lifespan of the encapsulation film, a method of manufacturing a display apparatus by using the deposition mask, and a display apparatus manufactured by the method. The deposition mask has a first portion and a second portion, the second portion being thicker that the first portion; at least one opening in the first portion, deposition materials being passed through the opening; and a plurality of through-holes in the first portion adjacent to and surrounding the opening, the through-holes extending from an upper surface to a lower surface of the first portion, light being passed through the opening and the plurality of through-holes to irradiate the deposition materials.

18 Claims, 11 Drawing Sheets

DEPOSITION MASK, METHOD OF MANUFACTURING DISPLAY APPARATUS BY USING THE DEPOSITION MASK, AND DISPLAY APPARATUS MANUFACTURED BY THE METHOD

CLAIM OF PRIORITY

This application makes reference to, incorporates the same herein, and claims all benefits accruing under 35 U.S.C. §119 from an application earlier filed in the Korean Intellectual Property Office on the 16 of Apr. 2013 and there duly assigned Serial No. 10-2013-0041835.

BACKGROUND OF THE INVENTION

1. Field of the Invention

The present invention relates to a deposition mask, a method of manufacturing a display apparatus by using the deposition mask, and a display apparatus manufactured by the method, and more particularly, to a deposition mask that prevents the occurrence of defects when forming an encapsulation film so that a long lifespan of the encapsulation film is ensured, a method of manufacturing a display apparatus by using the deposition mask, and a display apparatus manufactured by the method.

2. Description of the Related Art

Generally, a process of manufacturing a display apparatus includes a deposition process for forming a certain film on a substrate. In the deposition process, a mask including an opening corresponding to a portion where a film on a substrate is to be formed is closely attached to the substrate or is placed around the substrate, and then materials are discharged from a source on a predetermined area of a substrate after passing through the opening.

However, in the case of a mask used in the conventional deposition process, structures such as an already formed film may be damaged in a deposition process for forming a certain film, or defects, delamination, or lifespan reduction of a form film may be caused.

SUMMARY OF THE INVENTION

The present invention provides a deposition mask that prevents the occurrence of defects when forming an encapsulation film so that a long lifespan of the encapsulation film is ensured, a method of manufacturing a display apparatus by using the deposition mask, and a display apparatus manufactured by the method.

According to an aspect of the present invention, there is provided a deposition mask having an opening through which deposition materials pass and a plurality of through-holes from an upper surface to a lower surface of a first portion most adjacent to the opening, wherein a thickness of a second portion of the deposition mask is greater than a thickness of the first portion, the second portion being second most adjacent to the opening.

The upper surface of the first portion and an upper surface of the second portion may be located on a same plane.

A density of the plurality of through-holes in the first portion may be uniform.

According to another aspect of the present invention, there is provided a deposition mask having a plurality of openings through which deposition materials pass, and a plurality of through-holes from an upper surface to a lower surface of a first portion most adjacent to each of the plurality of openings, wherein a thickness of a second portion of the deposition mask is greater than a thickness of the first portion, the second portion being second most adjacent to each of the plurality of openings.

The upper surface of the first portion and an upper surface of the second portion may be located on a same plane.

A density of the plurality of through-holes in the first portion may be uniform.

According to another aspect of the present invention, there is provided a method of manufacturing a display apparatus, including: forming a display unit on a substrate; forming an inorganic film to cover the display unit; arranging a deposition mask on the substrate such that an opening through which deposition materials pass corresponds to the display unit, and a lower surface of a second portion, which is second most adjacent to the opening and is thicker than a first portion that is most adjacent to the opening, contacts a portion of the substrate so that the deposition mask does not contact the inorganic film, the first portion including a plurality of through-holes from an upper surface to a lower surface thereof, the portion of the substrate not being covered by the inorganic film; forming a monomer film by depositing a monomer on the inorganic film; converting the monomer film into a polymer film by irradiating ultraviolet rays on the monomer film; and detaching the deposition mask from the substrate.

In the converting, the ultraviolet rays are irradiated on the first portion and the opening of the deposition mask.

The method may further include: forming an additional inorganic film to cover the polymer film.

The display unit may include an organic light emitting device.

According to another aspect of the present invention, there is provided a method of manufacturing a display apparatus, including: forming a plurality of display units on a substrate; forming an inorganic film to cover each of the plurality of display units; arranging a deposition mask on the substrate such that a plurality of openings through which deposition materials pass correspond to the plurality of display units, and a lower surface of a second portion, which is second most adjacent to each of the plurality of openings and is thicker than a first portion that is most adjacent to each of the plurality of openings, contacts a portion that is not covered by the inorganic film of the substrate so that the deposition mask does not contact the inorganic film, the first portion including a plurality of through-holes from an upper surface to a lower surface thereof; forming a monomer film by depositing a monomer on the inorganic film; converting the monomer film into a polymer film by irradiating ultraviolet rays on the monomer film; and detaching the deposition mask from the substrate.

In the converting, the ultraviolet rays may be irradiated on the first portion and the opening of the deposition mask.

The method may further include: forming an additional inorganic film to cover the polymer film.

The method may further include: forming an additional inorganic film to cover the polymer film; and cutting the substrate along a circumference of each of the plurality of display units.

The plurality of display units may include organic light emitting devices.

According to another aspect of the present invention, there is provided a display apparatus including: a substrate; a display unit formed on the substrate; an inorganic film that covers the display unit and extends to an external side of the display unit to contact the substrate; a first polymer film that is located on the inorganic film and has a first thickness, and a second polymer film that is located on the inorganic film at an external side of the first polymer film and has a second thickness smaller than the first thickness; and an additional inorganic film that covers the first polymer film and the second polymer film.

The display apparatus may further include: a third polymer film that is located on the substrate at an external side of the inorganic film and has a third thickness smaller than the first thickness, wherein the additional inorganic film covers the third polymer film.

The third thickness may be smaller than the second thickness.

The display unit may include an organic light emitting device.

The additional inorganic film may extend to an external side of the inorganic film so as to contact the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
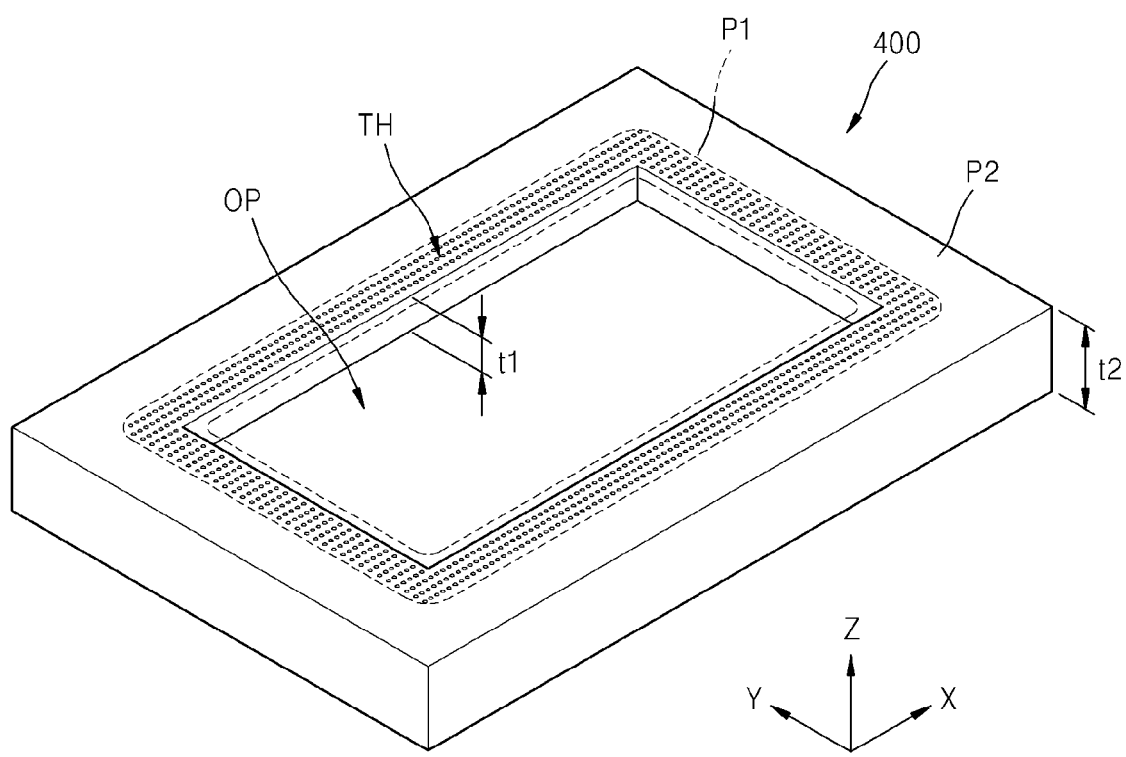
FIG. 1 is a perspective view schematically illustrating a deposition mask according to an embodiment of the present invention.

As used herein, the term "and/or" includes any and all combinations of one or more of the associated listed items.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

In the embodiments described below, an x-axis, a y-axis and a z-axis are not limited to the three axes of a rectangular coordinate system.

Furthermore, when a positional relationship between two items are described with the terms "on," "on the top of," and the like, one or more items may be interposed therebetween unless a description including the term "directly" is given.

FIG. 1 is a perspective view schematically illustrating a deposition mask 400 according to an embodiment of the present invention.

The deposition mask 400 according to an embodiment of the present invention includes an opening OP for allowing passage of deposition materials. As illustrated in FIG. 1, the opening OP is large, is formed in a central part of the deposition mask 400, and is used for forming a film that is not patterned on a wide area (also referred to as an open mask).

The deposition mask 400 may be divided into a first portion P1 and a second portion P2, the first portion P1 being disposed between the opening OP and the second portion P2. The second portion P2 may be the external part of the deposition mask 400. The thickness of the second portion P2 is greater than the thickness t1 of the first portion P1.

When the deposition mask 400 is used, even though the lower part of the second portion P2 contacts a substrate, the first portion P1 may not contact the substrate or another structure that has been formed on the substrate. As such, even though the deposition mask 400 is positioned on the substrate, damage of the substrate or another structure formed on the substrate via the deposition mask 400 may be prevented. To this end, the upper surface of the first portion P1 and the upper surface of the second portion P2 may be located on the same plane, however, the lower surface of the second portion P2 that comes in contact with the substrate may be protruded in a direction (−z direction) more than the first portion P1.

Furthermore, a plurality of through-holes TH is formed from the upper surface to the lower surface of the first portion P1. When light such as ultraviolet rays is irradiated from above the deposition mask 400, the light passes through the plurality of through-holes TH and reaches a portion of the substrate located below the first portion P1 of the deposition mask 400. A density of the plurality of through-holes TH in the first portion P1 may be uniform, and accordingly, the light may be evenly irradiated on the portion of the substrate located below the first portion P1 of the deposition mask 400 as well as the portion of the substrate exposed by the opening OP.

The deposition mask 400 may be made of a metal material such as SUS and/or Invar.

FIGS. 2 to 6 are sectional views for schematically illustrating a method of manufacturing a display apparatus according to another embodiment of the present invention, wherein a deposition mask according to the previous embodiment is used.

Figure 2:
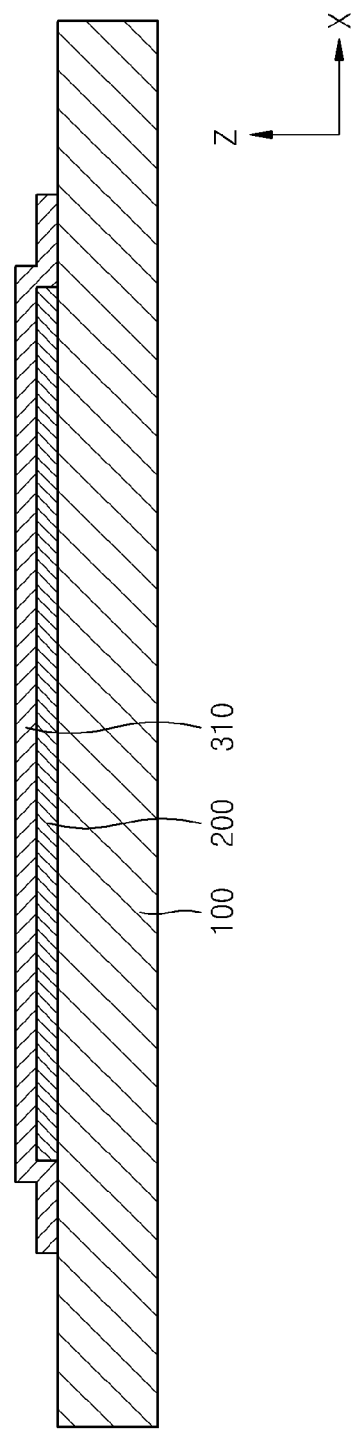
FIGS. 2 to 6 are sectional views schematically illustrating a process of manufacturing a display apparatus according to another embodiment of the present invention.

First, as illustrated in FIG. 2, a display unit 200 is formed on a substrate 100. The substrate 100 may be formed of various materials such as glass and plastic. The display unit 200 includes a plurality of display devices such as light emitting devices, electric field emission devices, liquid crystal display devices, etc. After forming the display unit 200 on the substrate 100, an inorganic film 310 is formed to cover the display unit 200.

The inorganic film 310 may cover the display unit 200 and extend to the external side of the display unit 200 so as to directly contact the substrate 100 and lateral side portions of the display unit 200. The inorganic film 310 may protect the display unit 200 from impurities such as external oxygen and water, and may include silicon nitride and/or silicon oxide, a metal oxide, a metal nitride, a metal carbonate, etc.

Figure 3:
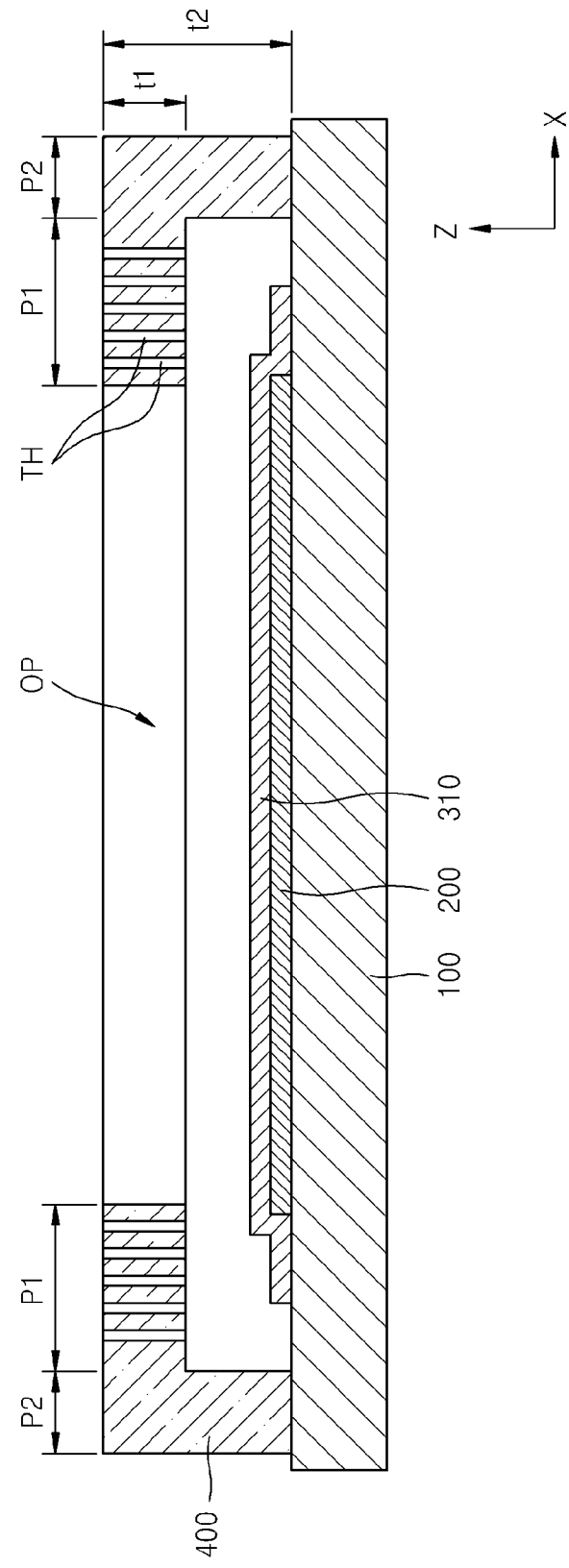

Thereafter, the deposition mask 400 as described with reference to FIG. 1 is disposed on the substrate 100 as illustrated in FIG. 3. The opening OP through which deposition materials pass corresponds to the display unit 200 on the substrate 100, and the lower surface of the second portion P2 contacts a portion of the substrate 100 not being covered by the inorganic film 310. As such, the deposition mask 400 may be arranged on the substrate 100 not to contact the inorganic film 310 formed on the substrate 100. The second portion P2 is thicker than the first portion P1 most adjacent to the opening OP, and the plurality of through-holes TH are formed from the upper surface to the lower surface of the first portion P1.

If a thickness difference is not formed on the lower side of the deposition mask 400 with regard to the first portion P1 and the second portion P2 of the deposition mask 400, a crack may be generated in the inorganic film 310 if the inorganic film 310 already formed on the substrate 100 contacts the deposition mask 400. This may finally cause deterioration of a function of the inorganic film 310 of protecting the display unit 200 from external impurities. Hence, in order to prevent the occurrence of such a problem, the first portion P1 and the second portion P2 of the deposition mask 400 have different thickness as described above.

Figure 4:
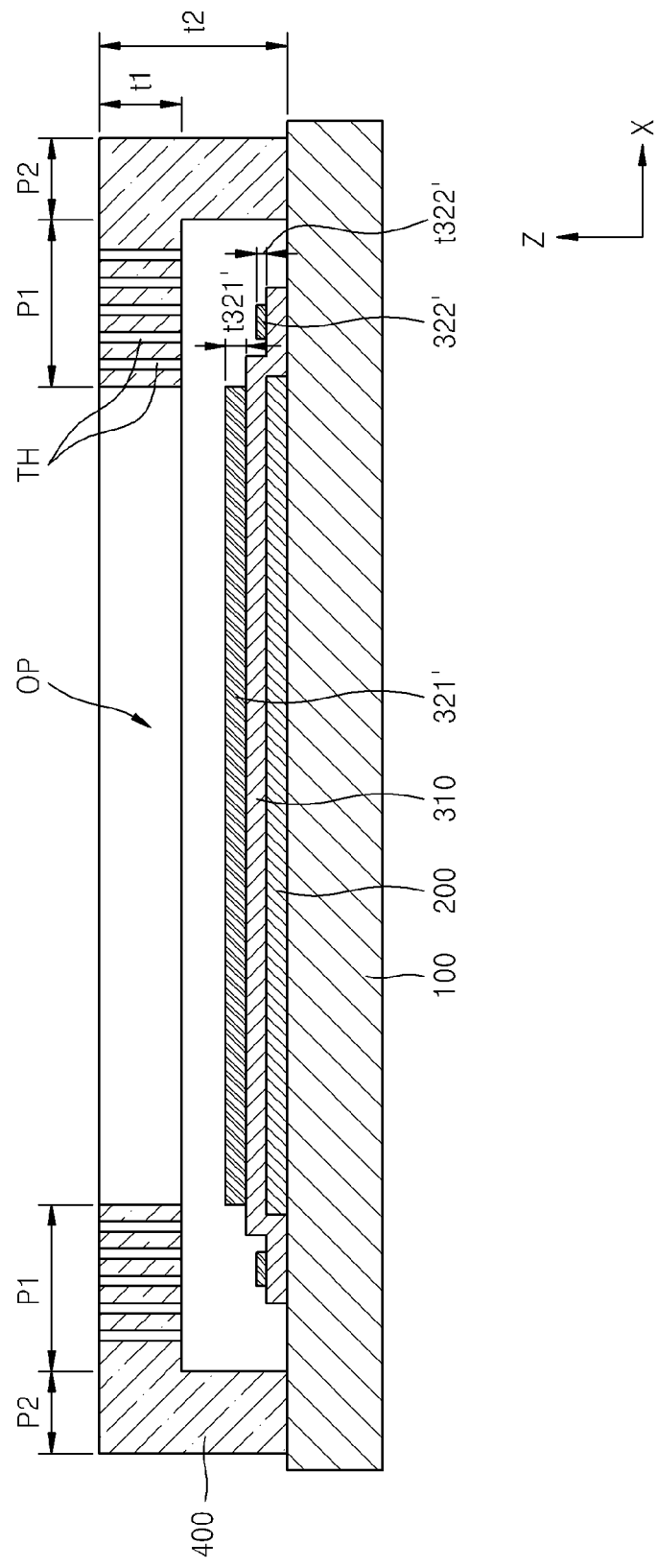

Thereafter, as illustrated in FIG. 4, a monomer is deposited on the inorganic film 310 so as to form a monomer film 321'. The monomer film 321' may be formed by using a flash evaporation method. For example, the monomer in a gaseous state may move from a source to the substrate 100 by instant evaporation thereof through lowering the boiling point of the monomer by changing the state of the monomer from a high temperature and/or a high pressure to a low pressure state. The monomer may contain acrylate series, epoxy series, and a combination thereof.

Thus, the monomer in the gaseous state may pass through the opening OP of the deposition mask 400 and condense in a portion, corresponding to the opening OP, on the upper surface of the inorganic film 310 thereby forming the monomer film 321'. However, in this process, after passing through the opening OP of the deposition mask 400, the monomer may condense not only in a portion corresponding to the opening OP on the upper surface of the inorganic film 310, but also condense in a portion corresponding to a space on the upper surface of the inorganic film 310 by moving to a space between the substrate 100 and the first portion P1 of the deposition mask 400.

FIG. 4 illustrates a monomer film 322' formed as described above. The monomer film 322' is positioned on the inorganic film 310, and may be positioned away from the monomer film 321' corresponding to the display unit 200. Furthermore, the monomer film 321' and the monomer film 322' may be connected. In either case, the monomer film 321' is formed as the monomer in the gaseous state is moved in the direction of the substrate 100 through the opening OP of the deposition mask 400, and the monomer film 322' is formed as the monomer in the gaseous state is further moved to a space between the substrate 100 and the deposition mask 400. Hence, the thickness t321' of the monomer film 321' may be larger than the thickness t322' of the monomer film 322'.

Figure 5:
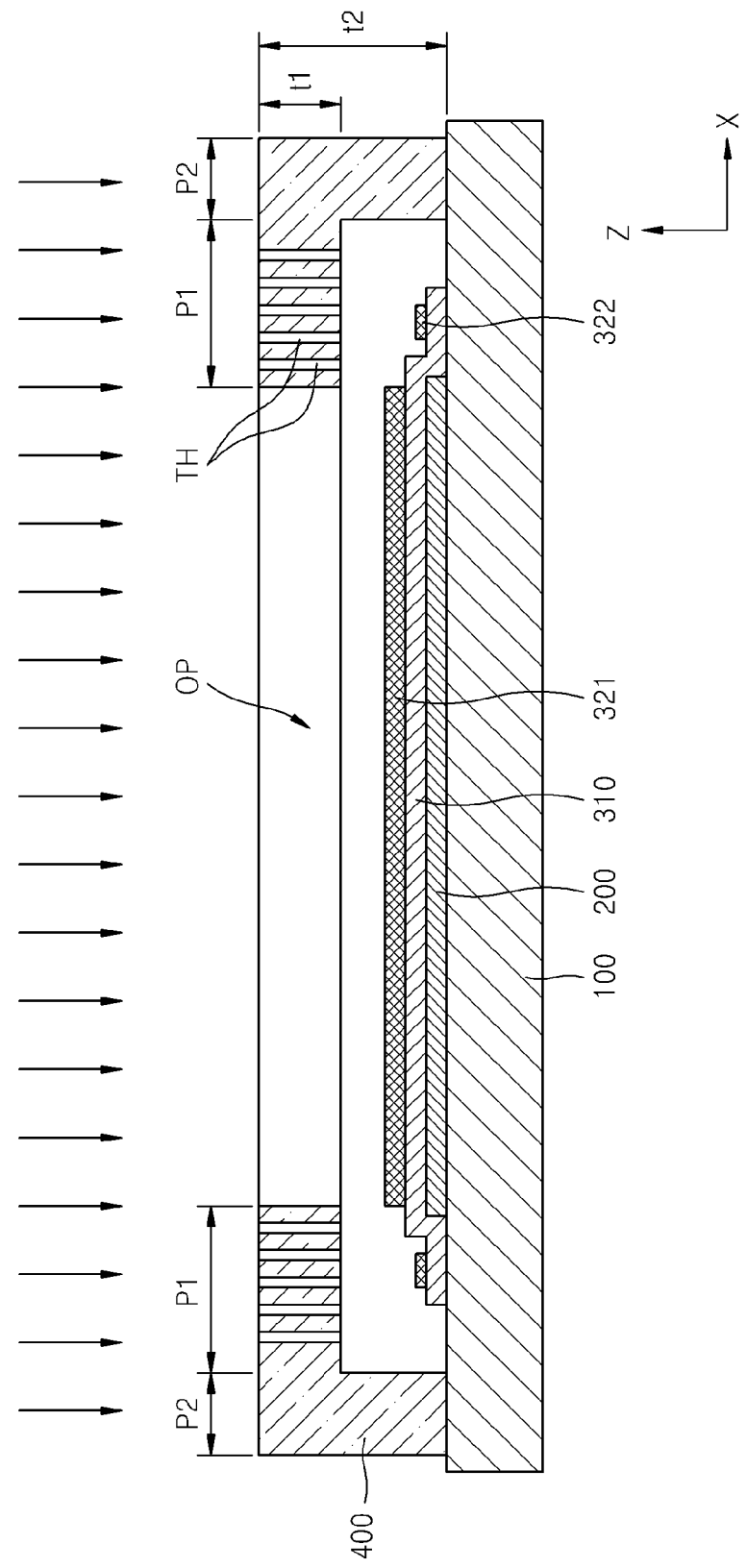

Thereafter, as illustrated in FIG. 5, light such as ultraviolet rays is irradiated on the monomer films 321' and 322' so as to convert the monomer films 321' and 322' into polymer films 321 and 322. The plurality of through-holes TH are formed from the upper surface to the lower surface of the first portion P1 of the deposition mask 400. When the light is irradiated from, for example, above the deposition mask 400, the light passes through the plurality of through-holes TH. Hence, if the light rays are irradiated on the opening OP and the first portion P1 of the deposition mask 400, the light may be irradiated not only on the monomer film 321' corresponding to the opening OP of the deposition mask 400, but also on the monomer film 322' located on the portion shielded by the first portion P1 of the substrate and located below the lower part of the deposition mask 400. As a result, both the monomer film 321' and the monomer film 322' may be converted into the polymer film 321 and the polymer film 322, respectively.

Furthermore, after forming the monomer film 321' and the monomer film 322', the deposition mask 400 may be removed, and the light may be irradiated on the monomer film 321' and the monomer film 322'. However, the monomer film 321' and the monomer film 322' which are in a liquid state have high fluidity, and thus, the thickness uniformities of the monomer film 321' and the monomer film 322' may become different in the process of removing the deposition mask 400 or after irradiating the light. Hence, it may be necessary to quickly irradiate the light when the monomer film 321' and the monomer film 322' are formed and the deposition mask 400 is still not removed. Thus, several problems may be resolved by using the deposition mask 400 including a plurality of through-holes TH in the first portion P1.

Figure 6:
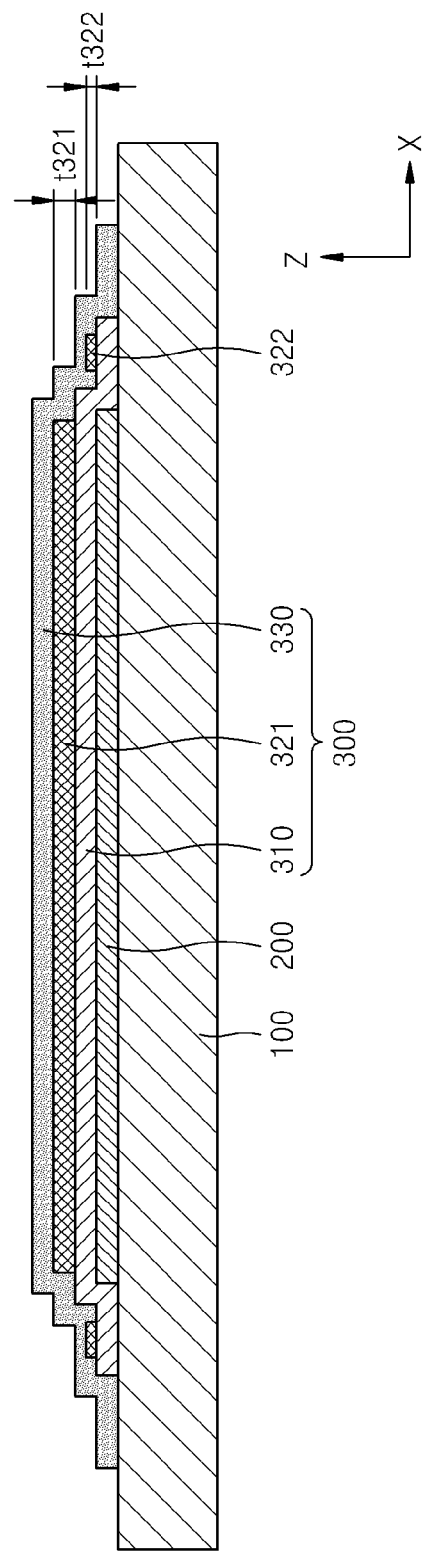

Thereafter, the deposition mask 400 may be detached from the substrate 100, and an additional inorganic film 330 may be formed to cover the polymer films 321 and 322 as described in FIG. 6 so as to manufacture a display apparatus. In this case, the inorganic film 310, the polymer films 321 and 322, and the additional inorganic film 330 form an encapsulation film 300 that protects the display unit 200 from impurities such as external oxygen or moisture. The additional inorganic film 330 may be formed of various materials such as silicon nitride and/or silicon oxide, a metal oxide, a metal nitride, or metal carbonate, etc.

The display unit 200 may include an organic light emitting device, and the organic light emitting device may include an intermediate layer including electrodes facing each other and at least a light emitting layer interposed between the electrodes. The intermediate layer may contain organic matter, and thus, such an organic light emitting device may be easily deteriorated by oxygen or moisture. However, in the case of the method of manufacturing according to the present embodiment, the encapsulation film 300 including the inorganic film 310, the polymer films 321 and 322 and the additional inorganic film 330 may cover the display unit 200 so as to protect the display unit 200 from impurities such as external oxygen and moisture.

Furthermore, the monomer film 321' and the monomer film 322' are converted into the polymer film 321 and the polymer film 322 by irradiating ultraviolet rays as described above with reference to FIG. 5. At this time, if the plurality of through-holes TH are not formed from the upper surface to the lower surface of the first portion P1 of the deposition mask 400, the light is irradiated on the monomer film 321' through the opening OP, and thus, the monomer film 321' is converted into the polymer film 321, but the light would not be irradiated on the monomer film 322' located at the portion shielded by the first portion P1 of the substrate and located below the lower portion of the deposition mask 400. Hence, the monomer film 322' may not be converted into the polymer film.

If the additional inorganic film 330 is formed to cover the polymer film 321 and the monomer film 322' in a state where the monomer film 322' is not converted into the polymer film, the monomer film 322', which is not converted into the polymer film, includes a liquid monomer, and thus, the bonding force between the additional inorganic film 330 and the inorganic film 310 may be weakened. As a result, the additional inorganic film 330 may be delaminated or may be later easily delaminated, and in this case, the organic light emitting device of the display unit may be easily deteriorated by external impurities.

However, in the method of manufacturing a display apparatus according to an embodiment of the present invention, the plurality of through-holes 400 are formed from the upper surface to the lower surface of the first portion P1 of the deposition mask 400 as described above. Thus, when the light is irradiated on the upper part of the deposition mask 400, the light may be irradiated not only on the monomer film 321' corresponding to the opening OP of the deposition mask 400, but also on the monomer film 322' located at the portion shielded by the first portion P1 of the substrate and located below that portion of the deposition mask 400. As a result, both the monomer film 321' and the monomer film 322' may be converted into the polymer film 321 and the polymer film 322. As such, deterioration of the bonding force between the inorganic film 310 and the additional inorganic film 330 or delamination of the additional inorganic film 330 may be effectively prevented.

Figure 7:
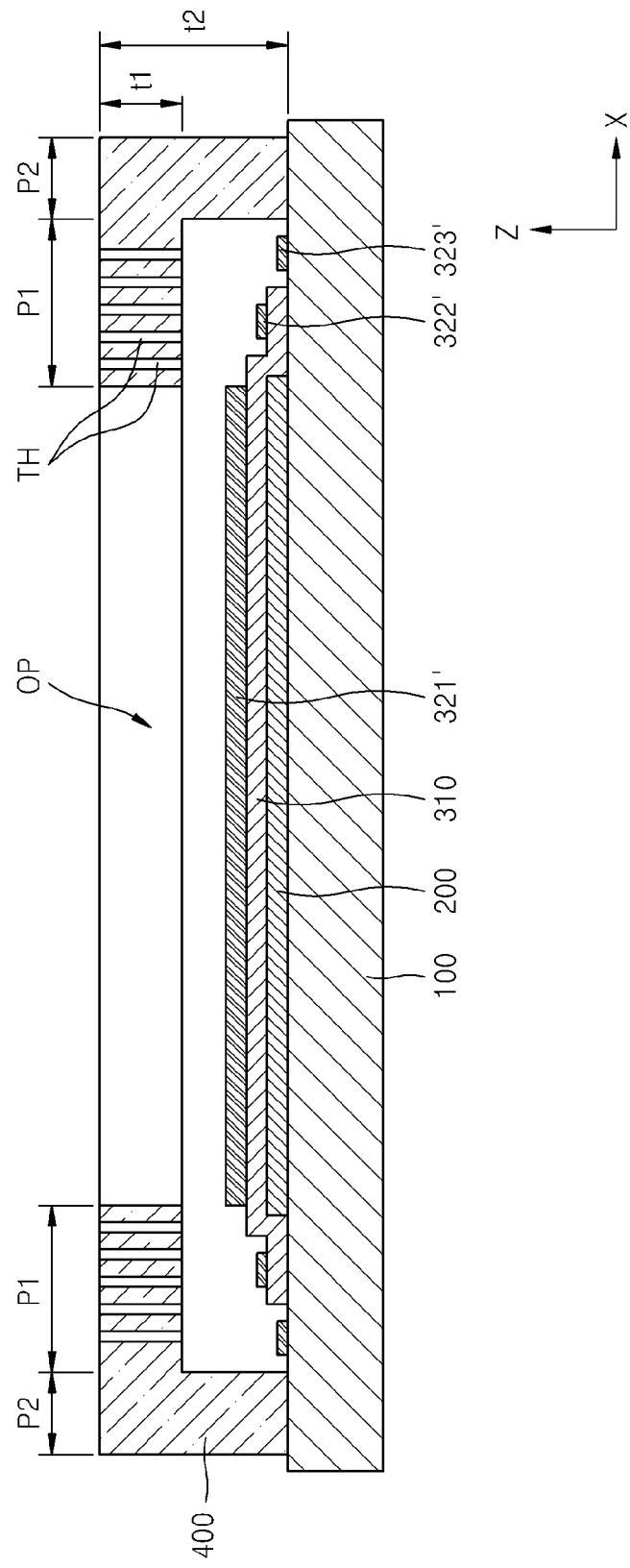
FIGS. 7 and 8 are sectional views schematically illustrating a process of manufacturing a display apparatus according to another embodiment of the present invention.
Figure 8:
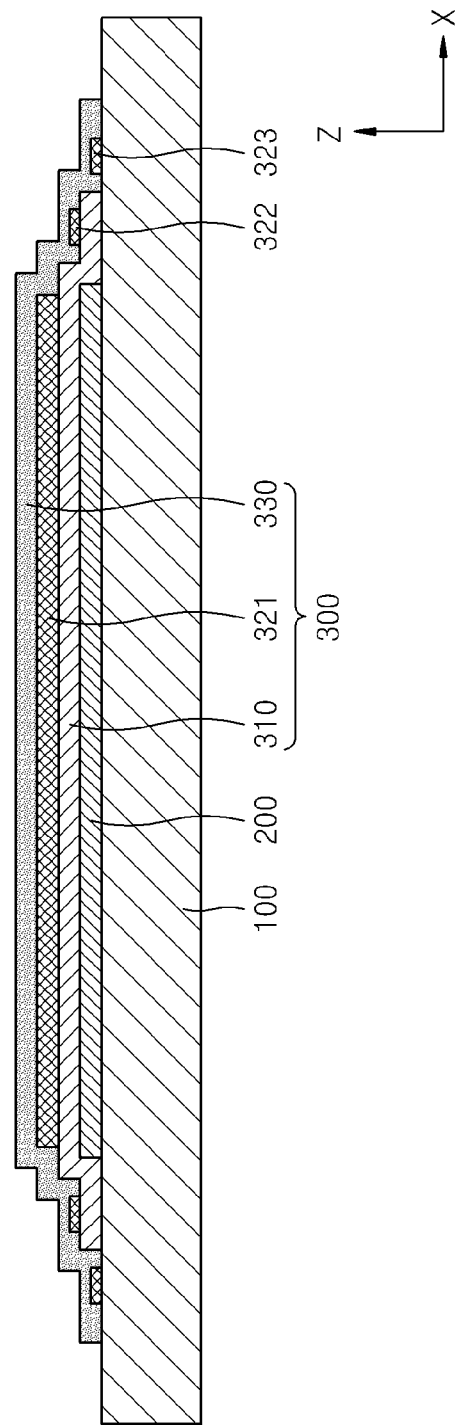

FIGS. 7 and 8 are sectional views schematically illustrating a method of manufacturing a display apparatus according to another embodiment of the present invention.

In the method of manufacturing a display device according to the embodiment of the present invention described with reference to FIG. 4, the forming of the monomer film 321' and the monomer film 322' on the inorganic film 310 has been described. In the case of a method of manufacturing a display apparatus according to the current embodiment of the present invention, the monomer film 321' and the monomer film 322' are formed on the inorganic film 310, and an additional monomer film 323' may also be formed on a portion that is not covered by the second portion P2 of the deposition mask 400 in a portion of the substrate, the portion of the substrate not covered by the inorganic film 310, as illustrated in FIG. 7.

When the monomer film 321' is formed on the inorganic film 310 by using a flash deposition method, etc., the monomer in the gaseous state pass through the opening OP of the deposition mask 400, and condenses on the upper surface of the inorganic film 310, so as to form the monomer film 321'. In this process, the monomer in the gaseous state pass through the opening OP of the deposition mask 400, and then condenses not only in a portion corresponding to the opening OP in the upper surface of the inorganic film 310, but also may move to a space between the substrate 100 and the first portion P1 of the deposition mask 400 and condense at a portion corresponding to the space in the upper surface of the inorganic film 310. Furthermore, the monomer in the gaseous state may further move, and may condense at a portion that is not covered by the second portion P2 of the deposition mask 400 at the portion of the substrate 100 where the portion of the substrate 100 is not covered by the inorganic film 310.

The monomer film 323' may be formed away from the monomer film 322' as illustrated in FIG. 7. Also, the monomer film 323' may be connected (not shown) to the monomer film 322'. In either case, the monomer in the gaseous state is further moved to a space between the substrate 100 and the deposition mask 400 without condensing on the inorganic film 310, and thus, the thickness of the monomer film 322' may be larger than the thickness of the monomer film 323'.

Likewise, a plurality of through-holes are formed from the upper surface to the lower surface of the first portion P1 of the deposition mask 400 used in the method of manufacturing a display apparatus according to an embodiment of the present invention. Hence, when light such as ultraviolet rays is irradiated on the upper part of the deposition mask 400, the light may be irradiated not only on the monomer film 321' corresponding to the opening OP of the deposition mask 400, but also on the monomer film 322' and the monomer film 323' located at a portion below the first portion P1 of the deposition mask 400. As a result, all of the monomer film 321', the monomer film 322', and the monomer film 323' may be respectively converted into the polymer film 321, the polymer film 322, and the polymer film 323 (FIG. 8). As such, deterioration of the bonding force between the inorganic film 310 and the additional inorganic film 330 (FIG. 8) or delamination of the additional inorganic film 330 may be effectively prevented.

The case where one display unit 200 is formed on one substrate 100 has been described above, but the present invention is not limited thereto.

Figure 9:
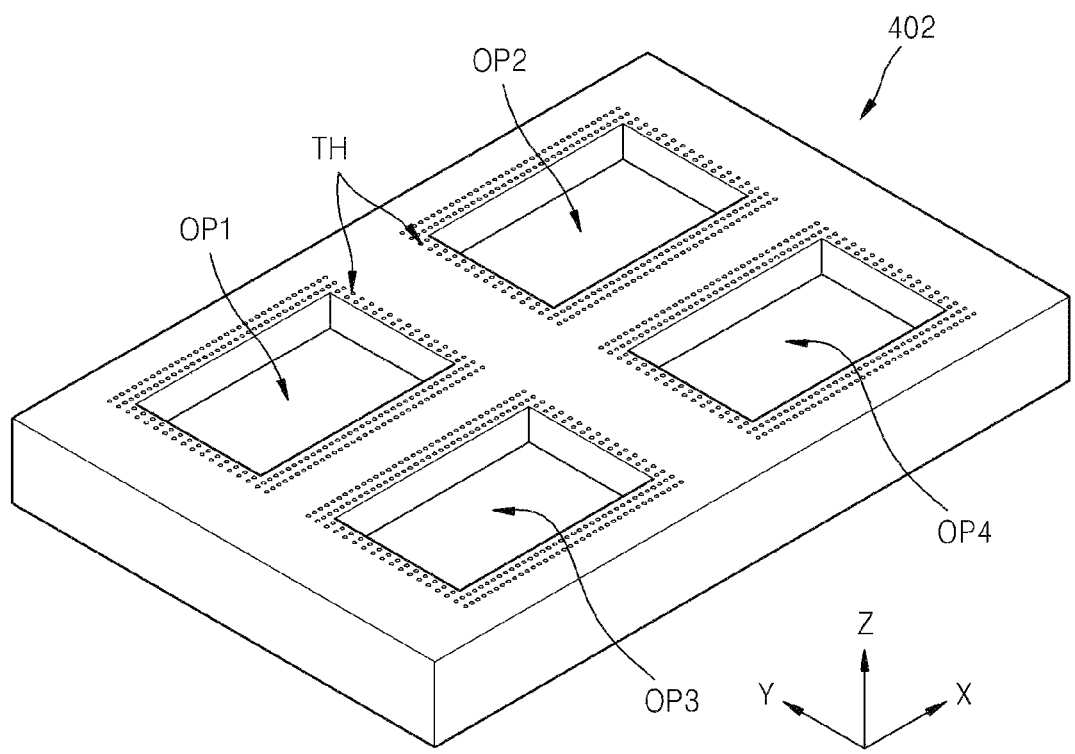
FIG. 9 is a perspective view schematically illustrating a deposition mask according to another embodiment of the present invention.

A deposition mask according to another embodiment of the present invention will be described with reference to FIG. 9.

A deposition mask 402 according to an embodiment of the present invention includes a plurality of openings OP1, OP2, OP3, and OP4 through which deposition materials may pass. FIG. 9 illustrates a case where the deposition mask 402 includes openings OP1, OP2, OP3, and OP4 for forming a non-patterned film on a wide area.

The deposition mask 402 may be divided into a first portion most adjacent to each of the plurality of openings OP1, OP2, OP3, and OP4, and a second portion adjacent to the first portion. A thickness of the second portion is greater than a thickness of the first portion.

When the deposition mask 402 is positioned on a substrate, even if the lower portion (in the −z direction) of the second portion of the deposition mask 402 contacts the substrate, the first portion of the deposition mask 402 may not contact the substrate or another structure that has been formed on the substrate. As such, even though the deposition mask 402 is located on the substrate, damage of the substrate or another structure formed on the substrate due to the deposition mask 402 may be prevented. To this end, the upper surface of the first portion of the deposition mask 402 and the upper surface of the second portion of the deposition mask 402 may be on the same plane, however, the lower surface of the second portion of the deposition mask 402 may protrude in a −z direction more than the first portion of the deposition mask 402, thus the thickness of the first portion will be less than the thickness of the second portion.

Furthermore, a plurality of through-holes TH are formed from the upper surface to the lower surface of the first portion of the deposition mask 402. When light, such as ultraviolet rays, is irradiated on the upper portion of the deposition mask 402, the light may pass through the plurality of through-holes TH and reach a portion partially shielded by the first portion and located below the lower portion of the deposition mask 402. A density of the plurality of through-holes TH in the first portion of the deposition mask 402 may be uniform, and thus, light may be evenly irradiated on the portion partially shielded by the first portion and located below the lower part of the first portion of the deposition mask 402.

Figure 10:
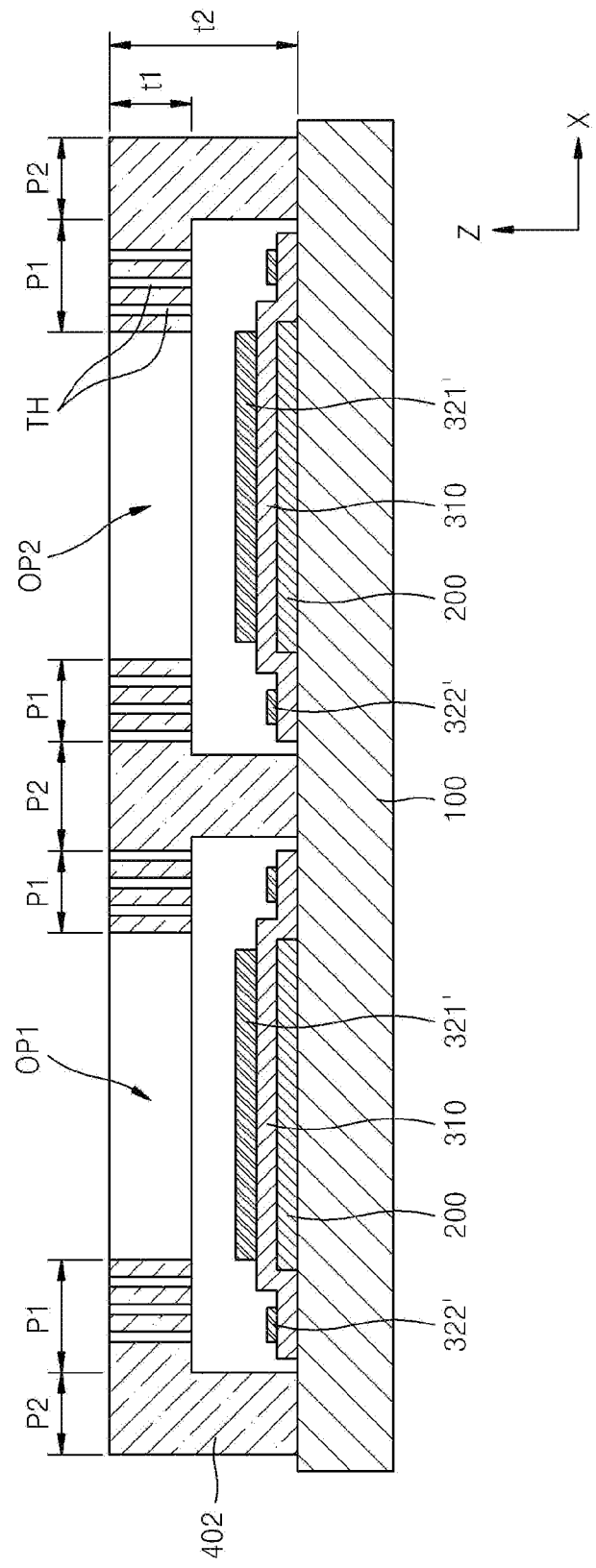
FIGS. 10 and 11 are sectional views schematically illustrating a process of manufacturing a display apparatus according to another embodiment of the present invention.
Figure 11:
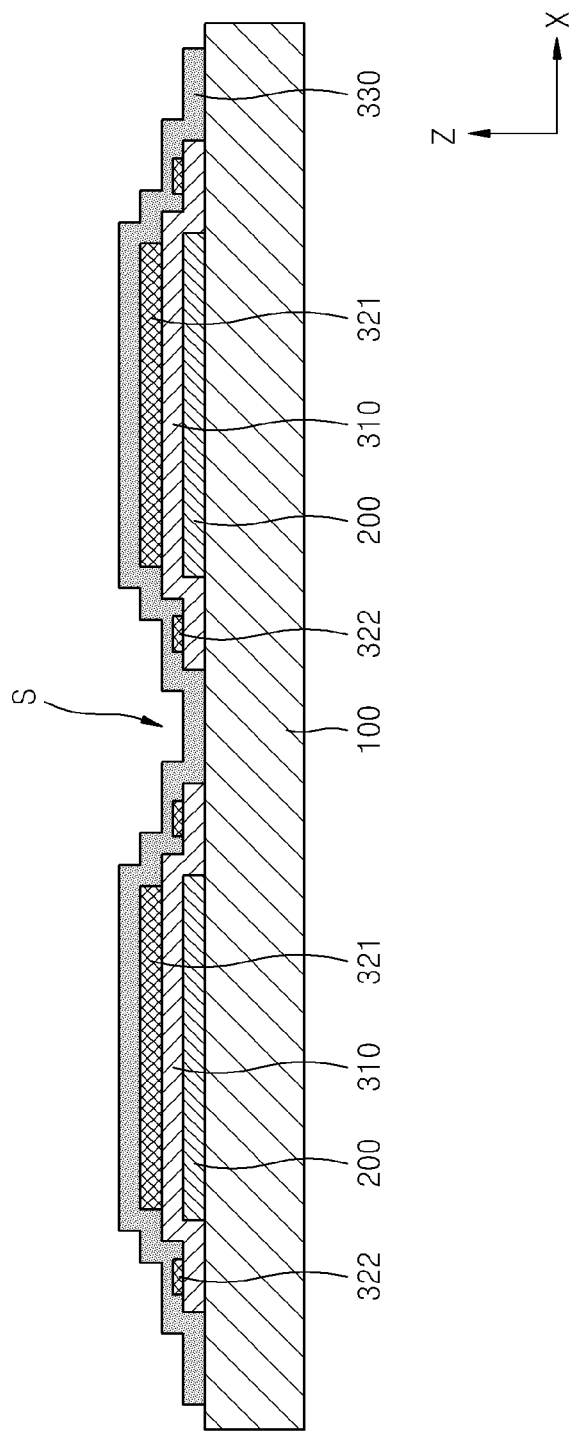

FIGS. 10 and 11 are sectional views schematically illustrating a process of manufacturing a display apparatus according to another embodiment of the present invention. A deposition mask according to the previous embodiment described with reference to FIG. 9 is used in the process.

First, as illustrated in FIG. 10, a plurality of display units 200 are formed on a substrate 100, and an inorganic film 310 is formed on each of the display units 200. The substrate 100 may be formed of various materials such as glass or plastic. The display units may be organic light emitting devices, electric field discharge devices, liquid crystal display devices, etc.

After the display units 200 are formed on the substrate 100, an inorganic film 310 is formed to cover each of the display units 200. The inorganic film 310 may contact and cover each of the display units 200, may contact and cover the lateral sides of the display unit 200 and may directly contact portions of the substrate 100.

Thereafter, a deposition mask 402 as described above with reference to FIG. 9 is arranged on the substrate 100 as illustrated in FIG. 10. At this time, the plurality of openings OP1 and OP2, through which deposition materials may pass, correspond to the plurality of display units 200 on the substrate 100, and the lower surface of the second portion P2, which has a thickness t2 larger than the thickness t1 of the first portion P1, contacts the portion of the substrate 100 that is not covered by the inorganic film 310. As such, the deposition mask 402 may be arranged on the substrate 100 not to contact the inorganic film 310 formed on the substrate 100. As a result, damage of the inorganic film 310, which protects each of the display units 200 from external impurities, may be prevented.

Thereafter, as illustrated in FIG. 10, a monomer film 321' is formed by depositing the monomer on the inorganic film 310. The monomer film 321' may be formed using flash evaporation. In this process, the monomer in a gaseous state may move to a space between the substrate 100 and the first portion P1 of the deposition mask 402, and may condense in a portion corresponding to the space on the upper surface of the inorganic film 310, thereby forming the monomer film 322'.

Thereafter, light, such as ultraviolet rays, may be irradiated on the monomer films 321' and 322' so as to convert the monomer films 321' and 322' into polymer films 321 and 322 (FIG. 11), and after detaching the deposition mask 402 from the substrate, an additional inorganic film 330 may be formed to cover most of the substrate 100, all exposed portions of the inorganic film 310 and the polymer films 321 and 322, as illustrated in FIG. 11. Thereafter, the substrate 100 may be cut along a portion S between the display units 200 so as to manufacture a plurality of display apparatuses.

Even when a plurality of display apparatuses are manufactured, a polymer film may be formed on the substrate 100 as illustrated in FIG. 8.

The deposition mask 402 and the method of manufacturing a display apparatus by using the deposition mask 402 have been described above, but the present invention is not limited thereto. That is, each display apparatus may have a structure as illustrated in FIG. 6, or may have a structure as illustrated in FIG. 8.

According to an embodiment of the present invention, a deposition mask that prevents the occurrence of defects when forming an encapsulation film in order to ensure a long lifespan of the encapsulation film, a method of manufacturing a display apparatus using the mask, and a display apparatus manufactured by the method may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a display apparatus, the method comprising:
   forming a display unit on a substrate;
   forming a first inorganic film on the substrate and covering all exposed surfaces of the display unit;
   arranging a deposition mask on the substrate, the deposition mask having a first area of a first thickness contacting a portion of the substrate not being covered by the first inorganic film and a second area of a second thickness less than the first thickness, the deposition mask not being in contact with the first inorganic film, the deposition mask including:
      an opening in the second area; and
      a plurality of through-holes in the second area adjacent to and surrounding the opening, the through-holes extending from an upper surface to a lower surface of the second area;
   forming a monomer film by depositing a monomer on the first inorganic film via the opening;
   converting the monomer film into a polymer film by irradiating ultraviolet rays on the monomer film through the opening and the plurality of through-holes; and
   detaching the deposition mask from the substrate.

2. The method of claim 1, further comprising forming a second inorganic film to cover exposed surfaces of the polymer film and the first inorganic film.

3. The method of claim 1, wherein the display unit includes an organic light emitting device.

4. A method of manufacturing a plurality of display apparatuses, the method comprising:
   forming a plurality of display units on a substrate;
   covering exposed surfaces of each of the plurality of display units with a corresponding plurality of first inorganic films;
   arranging a deposition mask on the substrate, the deposition mask having a first area of a first thickness contacting portions of the substrate not being covered by the first inorganic films and a second area of a second thickness less than the first thickness, the deposition mask not being in contact with the first inorganic films, the deposition mask including:
      a plurality of openings in the second area corresponding to the plurality of display units; and
      a plurality of through-holes in the second area adjacent to and surrounding each of the opening, the through-holes extending from an upper surface to a lower surface of the second area;
   forming monomer films on each of the first inorganic films by depositing a monomer via the plurality of openings;
   converting the monomer films into a polymer films by irradiating ultraviolet rays on the monomer films through the opening and the plurality of through-holes; and
   detaching the deposition mask from the substrate.

5. The method of claim 4, further comprising forming second inorganic films to cover exposed surfaces of the polymer films and the first inorganic films.

6. The method of claim 4, further comprising:
   forming second inorganic films to cover exposed surfaces of the polymer films and the first inorganic films; and
   cutting the substrate along a circumference of each of the plurality of display apparatuses.

7. The method of claim 4, wherein the plurality of display units include organic light emitting devices.

8. A display apparatus comprising:
   a substrate;
   a display unit formed on the substrate;
   a first inorganic film that covers the display unit and extends to an external side of the display unit to contact the substrate;
   a first polymer film that is located on the first inorganic film and has a first thickness, and a second polymer film that is located on the inorganic film at an external side of the first polymer film and has a second thickness smaller than the first thickness; and
   a second inorganic film that covers the first polymer film and the second polymer film.

9. The display apparatus of claim 8, further comprising:
   a third polymer film that is located on the substrate at an external side of the inorganic film and has a third thickness smaller than the first thickness, wherein the second inorganic film covers the third polymer film.

10. The display apparatus of claim 9, wherein the third thickness is smaller than the second thickness.

11. The display apparatus of claim 8, wherein the display unit comprises an organic light emitting device.

12. The display apparatus of claim 8, wherein the second inorganic film extends to an external side of the inorganic film so as to contact the substrate.

13. A display apparatus manufactured by the method of claim 1, comprising:
- a second polymer film that is located on the inorganic film at an external side of the polymer film and has a second thickness smaller than the first thickness; and
- a second inorganic film that covers the first polymer film and the second polymer film.

14. The display apparatus of claim 13, further comprising:
a third polymer film that is located on the substrate at an external side of the inorganic film and has a third thickness smaller than the first thickness, the second inorganic film covering the third polymer film.

15. The display apparatus of claim 14, wherein the third thickness is smaller than the second thickness.

16. A plurality of display apparatuses manufactured by the method of claim 4, comprising:
- second polymer films that are located on the inorganic films at external sides of the first polymer films and have second thicknesses smaller than the first thicknesses; and
- second inorganic films that cover the first polymer films and the second polymer films.

17. The display apparatuses of claim 16, further comprising:
third polymer films that are located on the substrate at external sides of the inorganic film and have third thicknesses smaller than the first thicknesses, the second inorganic films covering the third polymer films.

18. The display apparatuses of claim 17, wherein the third thicknesses are smaller than the second thicknesses.

* * * * *